(12) United States Patent
Weng

(10) Patent No.: US 11,901,193 B2
(45) Date of Patent: Feb. 13, 2024

(54) FABRICATION METHOD OF DEVICE WITH CAVITY

(71) Applicant: Shenzhen Newsonic Technologies Co., Ltd., Shenzhen (CN)

(72) Inventor: Guojun Weng, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/315,091

(22) Filed: May 10, 2023

(65) Prior Publication Data

US 2023/0274945 A1    Aug. 31, 2023

(30) Foreign Application Priority Data

Mar. 15, 2023   (CN) ......................... 202310283676.5

(51) Int. Cl.
| | |
|---|---|
| *H01L 21/311* | (2006.01) |
| *H01L 21/02* | (2006.01) |
| *H01L 21/762* | (2006.01) |
| *H01L 21/3065* | (2006.01) |
| *H01L 21/3105* | (2006.01) |

(52) U.S. Cl.
CPC .... *H01L 21/31122* (2013.01); *H01L 21/0214* (2013.01); *H01L 21/02164* (2013.01); *H01L 21/02178* (2013.01); *H01L 21/3065* (2013.01); *H01L 21/31053* (2013.01); *H01L 21/762* (2013.01)

(58) Field of Classification Search
None
See application file for complete search history.

(56) References Cited

U.S. PATENT DOCUMENTS

| | | | |
|---|---|---|---|
| 7,622,324 B2 * | 11/2009 | Enquist | B81C 1/00269 438/455 |
| 10,961,118 B2 * | 3/2021 | Lee | B81B 7/02 |

* cited by examiner

*Primary Examiner* — Roberts P Culbert
(74) *Attorney, Agent, or Firm* — Finnegan, Henderson, Farabow, Garrett & Dunner, LLP.

(57) ABSTRACT

A method for fabricating a device having a cavity, includes: obtaining a device wafer including a first substrate and a device structure formed on the first substrate, depositing a first dielectric layer on the device wafer, etching the first dielectric layer to expose at least a part of the device structure and a part of the first substrate, depositing, after the etching, a second dielectric layer on the device wafer and the first dielectric layer, performing a surface treatment on a surface of the second dielectric layer, obtaining a second substrate, and bonding the second substrate with the second dielectric layer on the device wafer, thereby forming the cavity between the second substrate and the device wafer.

17 Claims, 27 Drawing Sheets

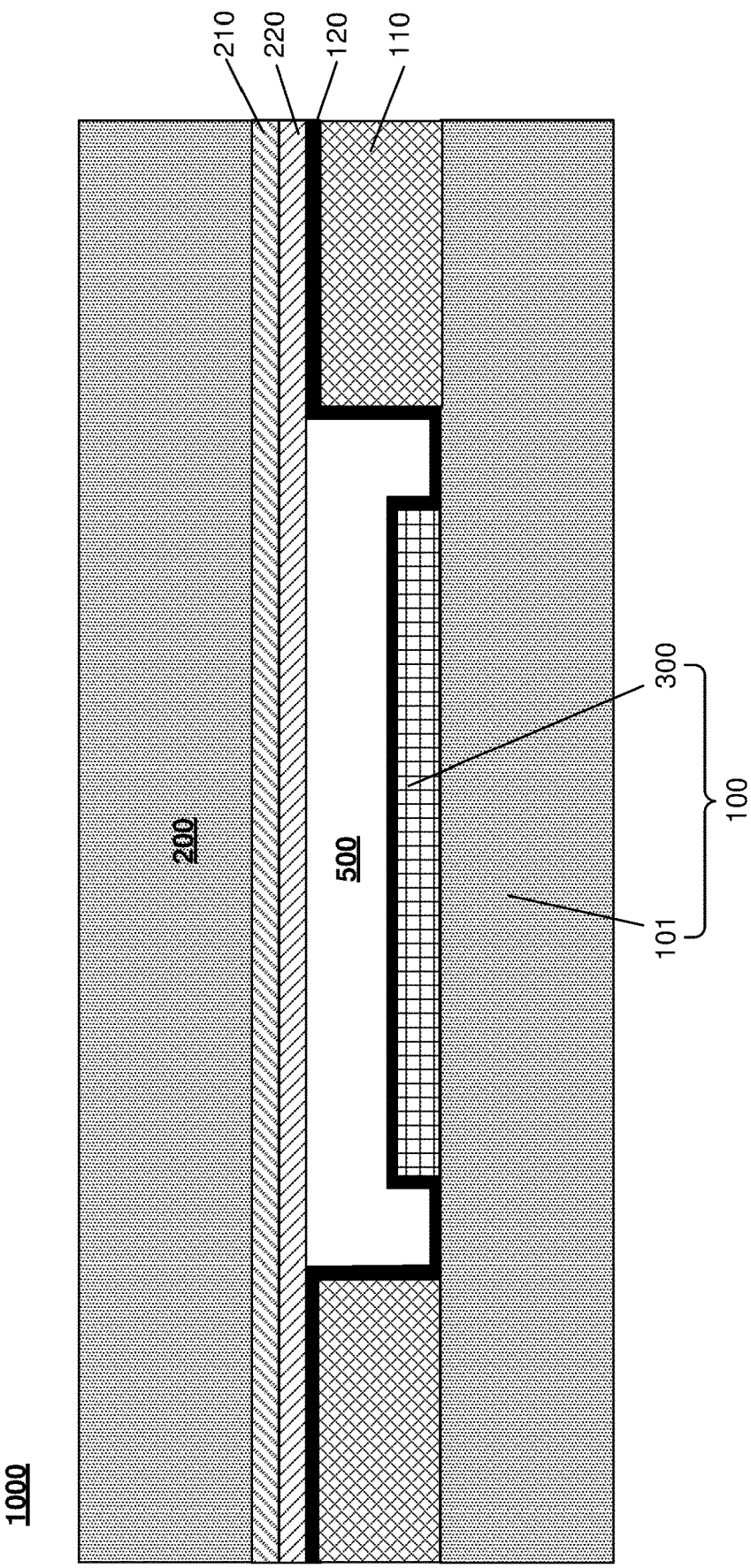

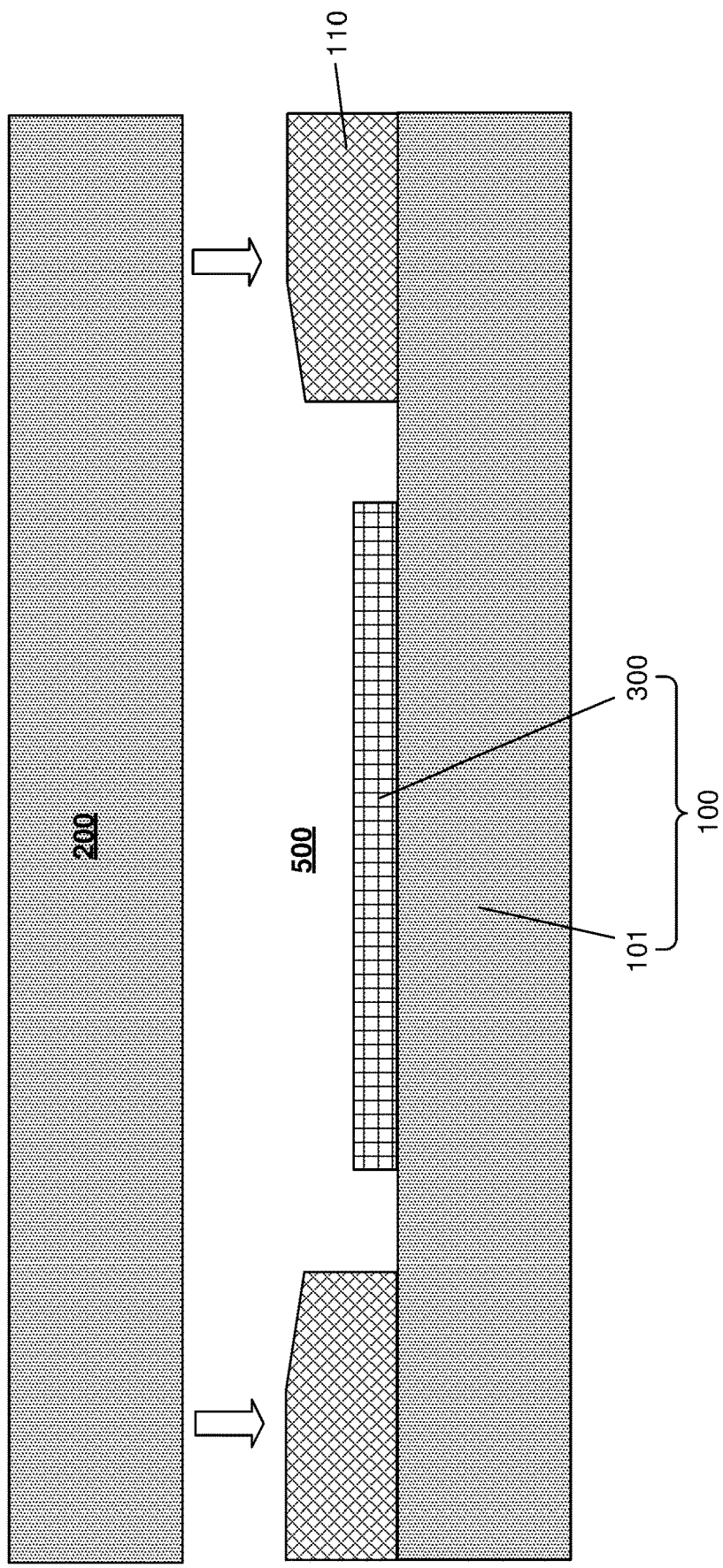

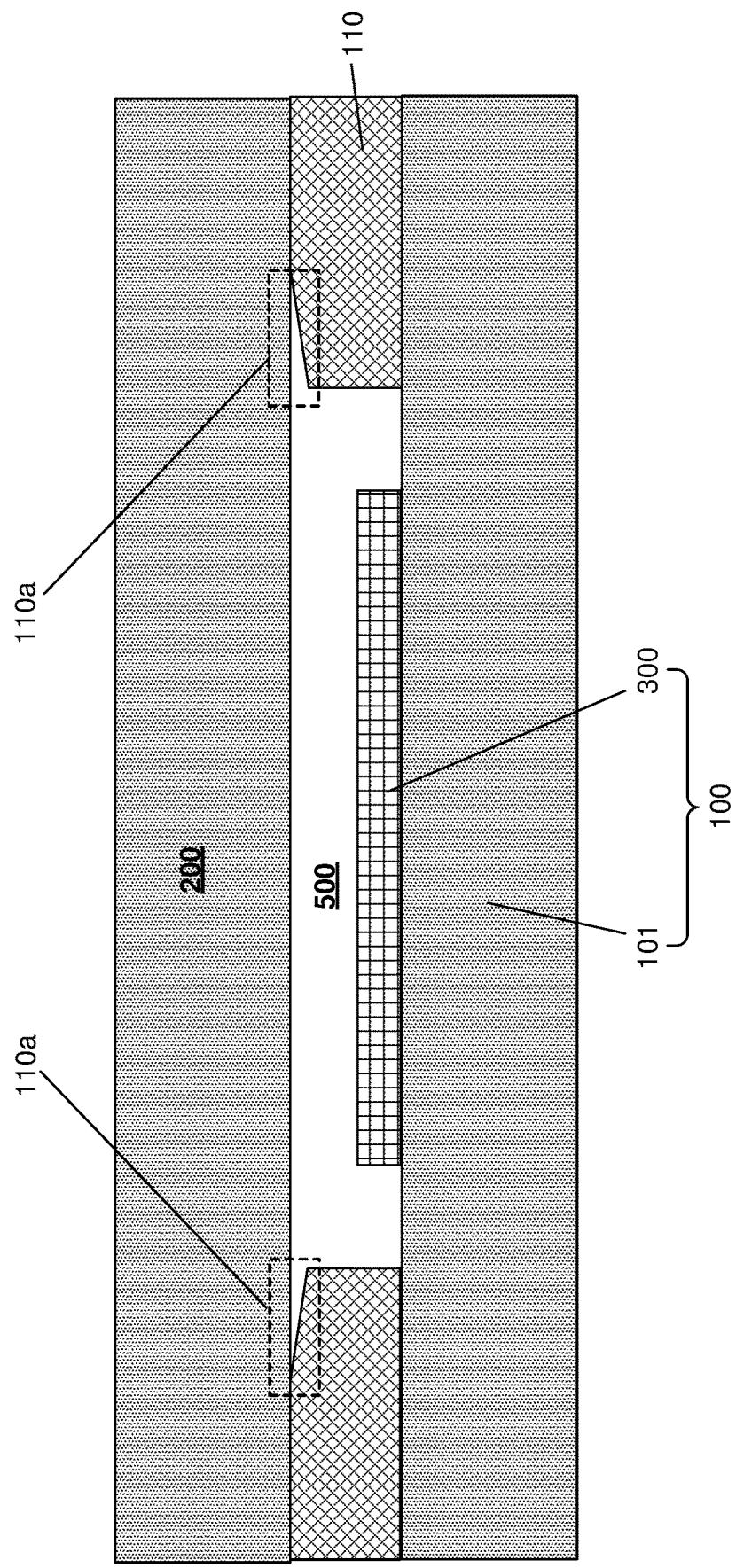

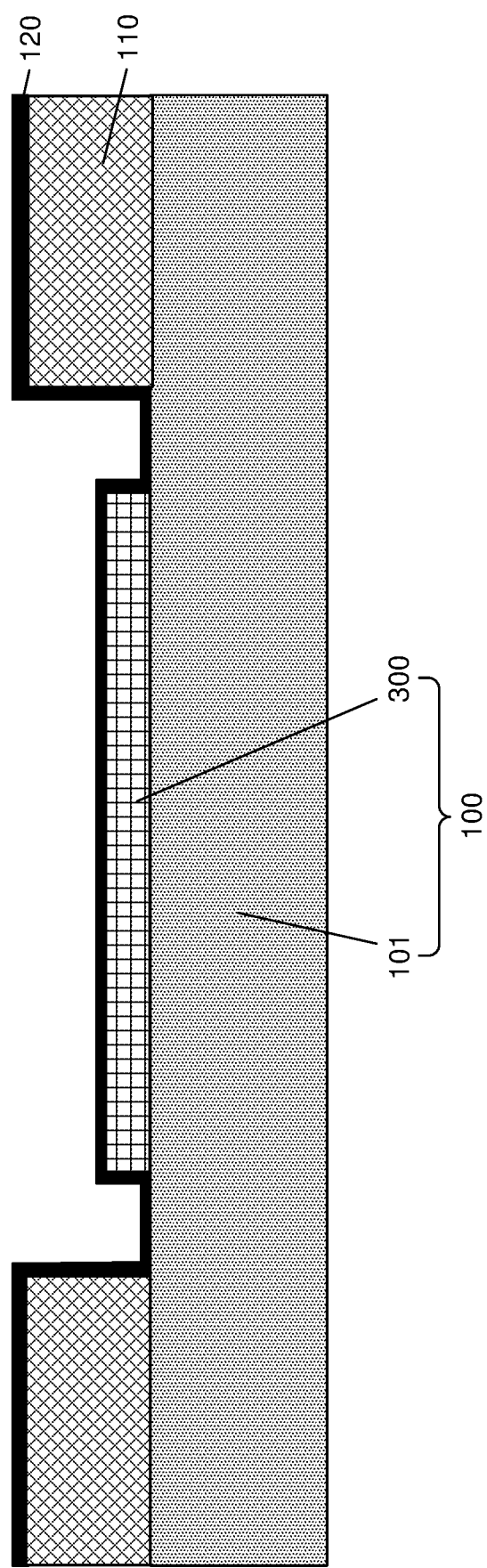

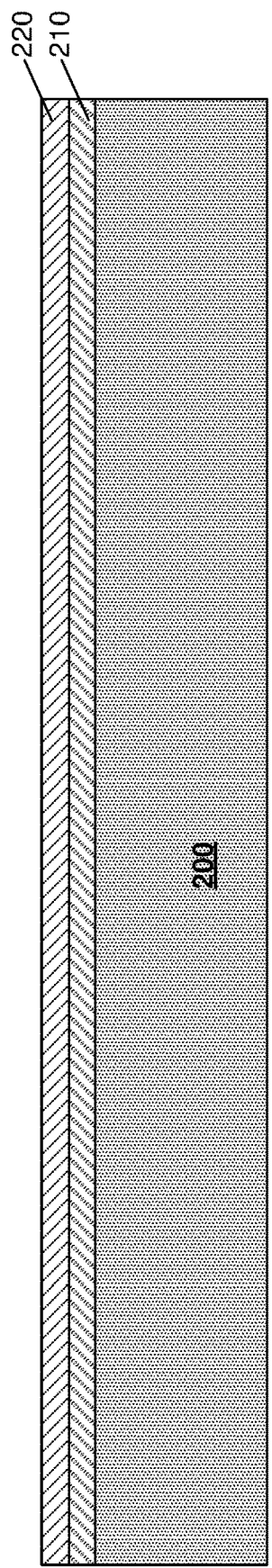

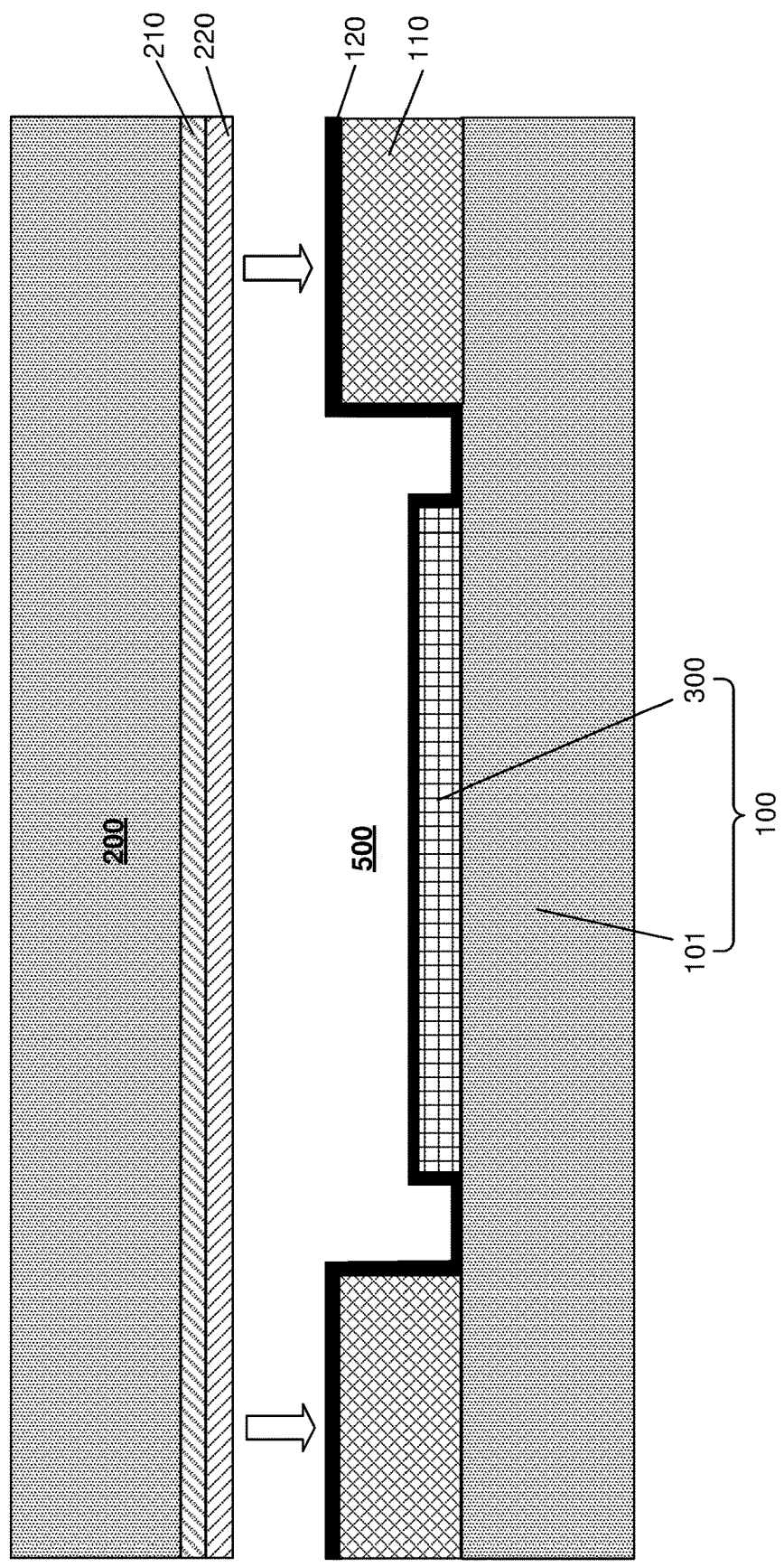

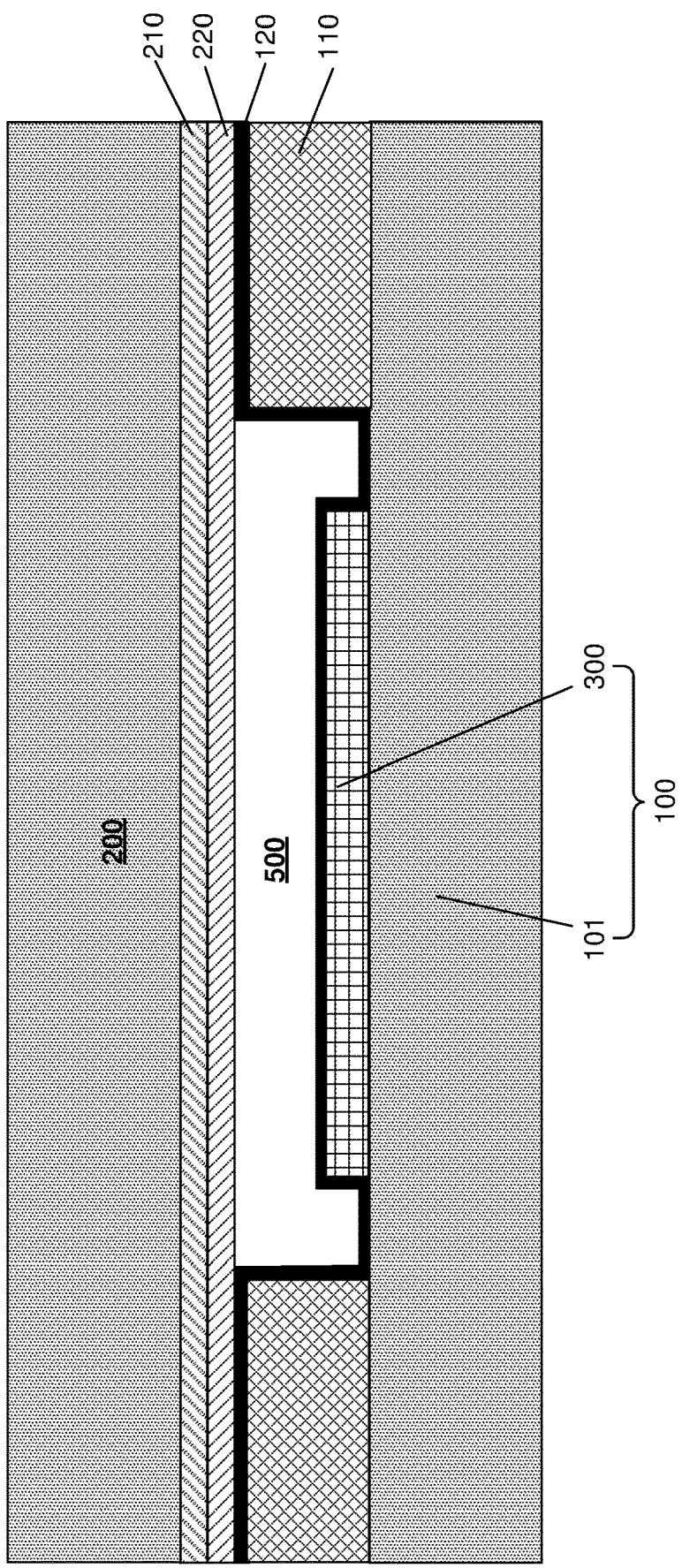

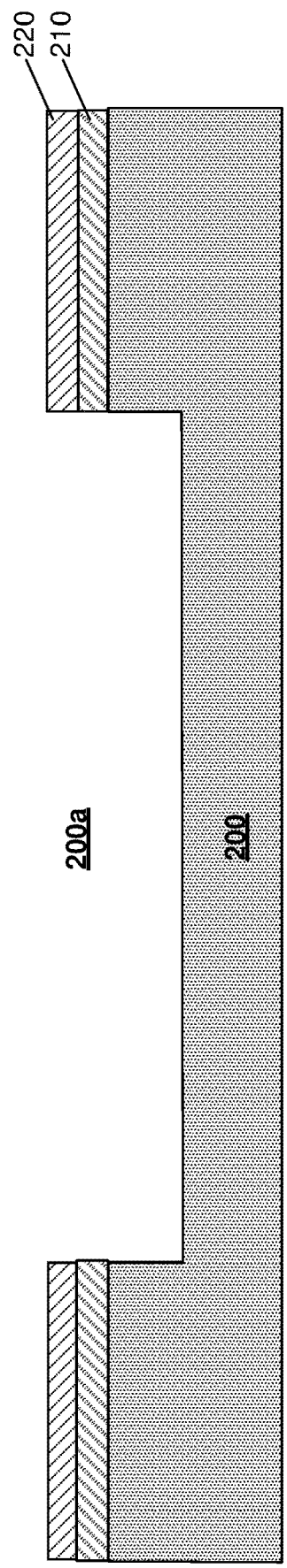

FABRICATION METHOD OF DEVICE WITH CAVITY

CROSS-REFERENCE TO RELATED APPLICATIONS

The present application is based on and claims priority to Chinese Patent Application No. 202310283676.5, filed on Mar. 15, 2023, the entire contents of which are hereby incorporated by reference.

FIELD OF THE DISCLOSURE

The present disclosure relates to the field of electronic devices and, in particular, to a method for fabricating a device with a cavity.

BACKGROUND

Devices such as film bulk acoustic resonator (FBAR) resonators or filters, microelectromechanical system (MEMS) microphones, pressure sensor, acceleration sensor, piezoelectric micromachined ultrasonic transducer (PMUT) may include a cavity structure in order to function properly. It is desirable to fabricate such devices with improved reliability.

SUMMARY

According to one aspect of the disclosure, a method for fabricating a device with a cavity is provided. The method includes obtaining a device wafer including a first substrate and a device structure formed on the first substrate, depositing a first dielectric layer on the device wafer, etching the first dielectric layer to expose at least a part of the device structure and a part of the first substrate, depositing, after the etching, a second dielectric layer on the device wafer and the first dielectric layer, performing a surface treatment on a surface of the second dielectric layer, obtaining a second substrate, and bonding the second substrate with the second dielectric layer on the device wafer, thereby forming the cavity between the second substrate and the device wafer.

BRIEF DESCRIPTION OF THE DRAWINGS

The accompanying drawings, which are incorporated in and constitute a part of this application, illustrate disclosed embodiments and, together with the description, serve to explain the disclosed embodiments.

FIG. 1 is a cross-sectional view of a device having a cavity, according to an embodiment of the present disclosure.

FIGS. 2A-2I are cross-sectional views of structures formed in a process of fabricating a device having a cavity, according to a comparative example.

FIGS. 4A-4J are cross-sectional views of structures formed in the process of FIG. 3, according to an embodiment of the present disclosure.

FIGS. 7A-7D are cross-sectional views of structures formed in the process of FIG. 6, according to an embodiment of the present disclosure.

DETAILED DESCRIPTION

Figure 2A:
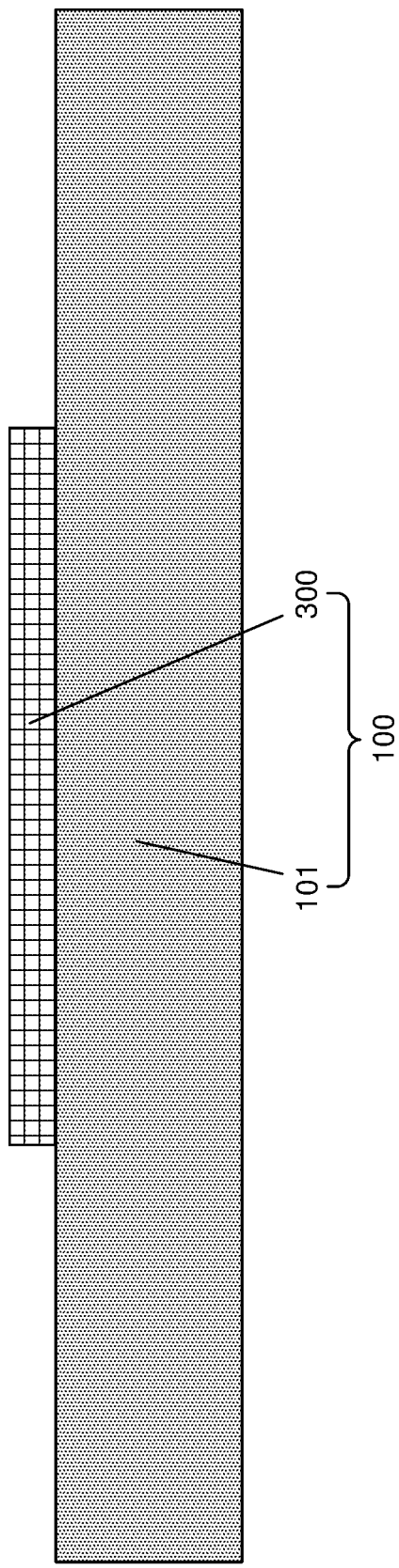

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "top," "bottom," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

A conventional method for fabricating a device with a cavity may include depositing a dielectric layer on a first substrate (a device wafer), planarizing the dielectric layer by chemical mechanical polishing (CMP), removing a part of the dielectric layer by etching to from space for forming the cavity, and bonding the first substrate with a second substrate (cap wafer) through the dielectric layer, to form the cavity. The CMP process is performed on the dielectric layer in order to prepare the surface of the dielectric layer to be suitable for bonding with the second substrate. However, the CMP process may cause a portion of the surface of the dielectric layer near the cavity space to be inclined, and the inclined surface may not be bonded to the second substrate. As a result, the effective bonding area will be reduced, and the bonding strength may be significantly affected, which negatively affects the reliability of the device.

Embodiments of the present disclosure provide an improved method for fabricating a device with a cavity, which does not form an inclined surface by a CMP process, thus effectively improves the bonding strength between the first substrate and the second substrate. According to one embodiment of the present disclosure, the fabrication method includes depositing a first dielectric layer on a first substrate formed with a device structure, planarizing the first dielectric layer by CMP, removing a part of the first dielectric layer by etching to form a cavity space, depositing a thin second dielectric layer to cover the surfaces of the first dielectric layer and the surfaces of the device structure, performing a microphysical etching process to remove a part of the second dielectric layer thus activating the surface of the second dielectric layer, and then bonding a second substrate to the second dielectric layer. The fabrication method according to the embodiment of the present disclosure may avoid the problem of "inclined surface" to ensure the attachment and bonding of the second dielectric layer without reducing the bonding area and bonding strength of the second substrate.

Some devices may require a larger cavity or a trap rich layer to help improving device performance. Therefore, in some embodiments of the present disclosure, a trap rich layer is added, or a recess is formed in the second substrate to increase the volume of the cavity.

FIG. 1 is a cross-sectional view of a device 1000 having a cavity 500, according to an embodiment of the present disclosure.

As illustrated in FIG. 1, device 1000 includes a device wafer 100 including a first substrate 101 and a device structure 300 disposed on first substrate 101, a first dielectric layer 110, a second dielectric layer 120, a second substrate (also referred to as a "cap wafer") 200, a trap rich layer 210, and a buffer layer 220.

Device structure 300 may include at least a portion of a semiconductor device or a microelectromechanical system (MEMS) device. For example, device structure 300 may include at least a portion of at least one of a film bulk acoustic resonator (FBAR) resonator or filter, a MEMS microphone, a pressure sensor, an acceleration sensor, or a piezoelectric micromachined ultrasonic transducer (PMUT), or another device having a cavity structure.

First dielectric layer 110 is disposed on first substrate 101 at both ends of device structure 300. First dielectric layer 110 is separated from both ends of device structure 300 with a predetermined distance. First dielectric layer 110 forms sidewalls of cavity 500.

Second dielectric layer 120 covers the top surface and side surfaces of first dielectric layer 110, the top surface and side surfaces of device structure 300, and a portion of the top surface of first substrate 101 between device structure 300 and first dielectric layer 110.

Trap rich layer 210 is disposed below second substrate 200. Buffer layer 220 is disposed below trap rich layer 210. Second substrate 200 is bonded to second dielectric layer 120 disposed on device wafer 100 through buffer layer 220 to form cavity 500.

FIGS. 2A-2I are cross-sectional views of structures formed in a process of fabricating a device having a cavity, according to a comparative example.

As illustrated in FIG. 2A, in step S0, device wafer 100 is obtained. Device wafer 100 includes first substrate 101 and device structure 300 formed on first substrate 101. Device structure 300 may include at least a portion of the device having the cavity to be fabricated. For example, the device may be a semiconductor device or a microelectromechanical system (MEMS) device, which may include at least one of a film bulk acoustic resonator (FBAR) resonator or filter, a MEMS microphone, a pressure sensor, an acceleration sensor, or a piezoelectric micromachined ultrasonic transducer (PMUT), or another device having a cavity structure.

Figure 2B:
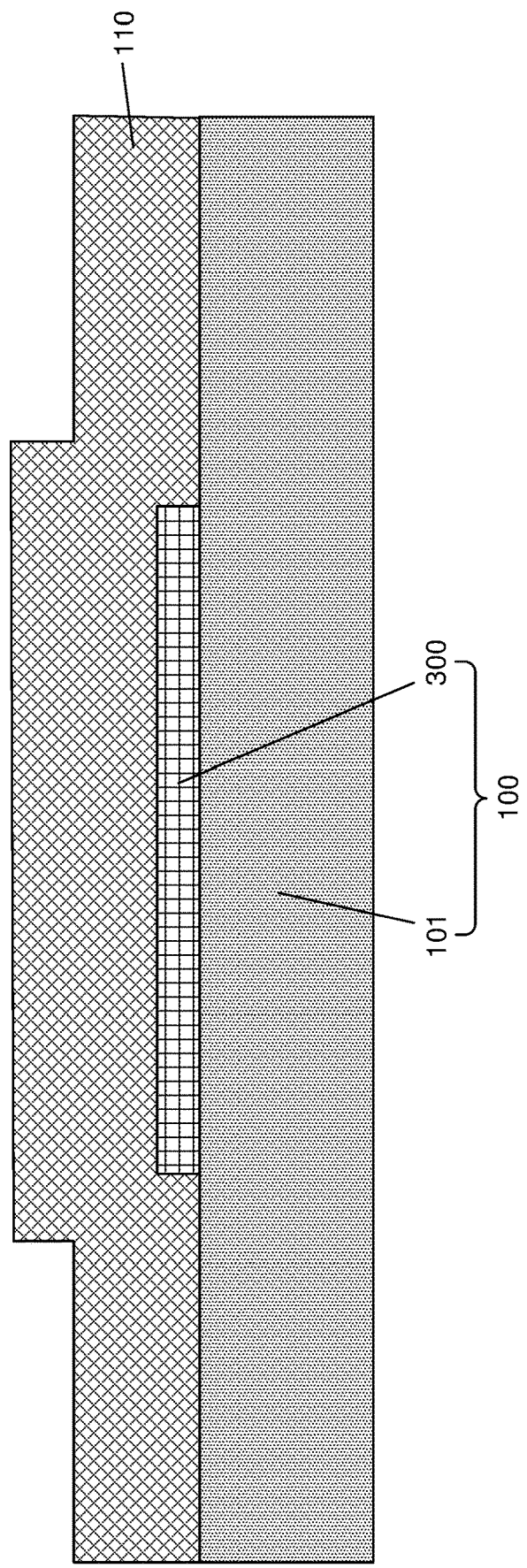

As illustrated in FIG. 2B, in step S1, first dielectric layer 110 is deposited on device wafer 100. First dielectric layer 110 may be formed of silicon, silicon oxide, silicon nitride, aluminum nitride, silicon oxynitride, or other materials, or a stacked combination of two or more of those materials.

Figure 2C:
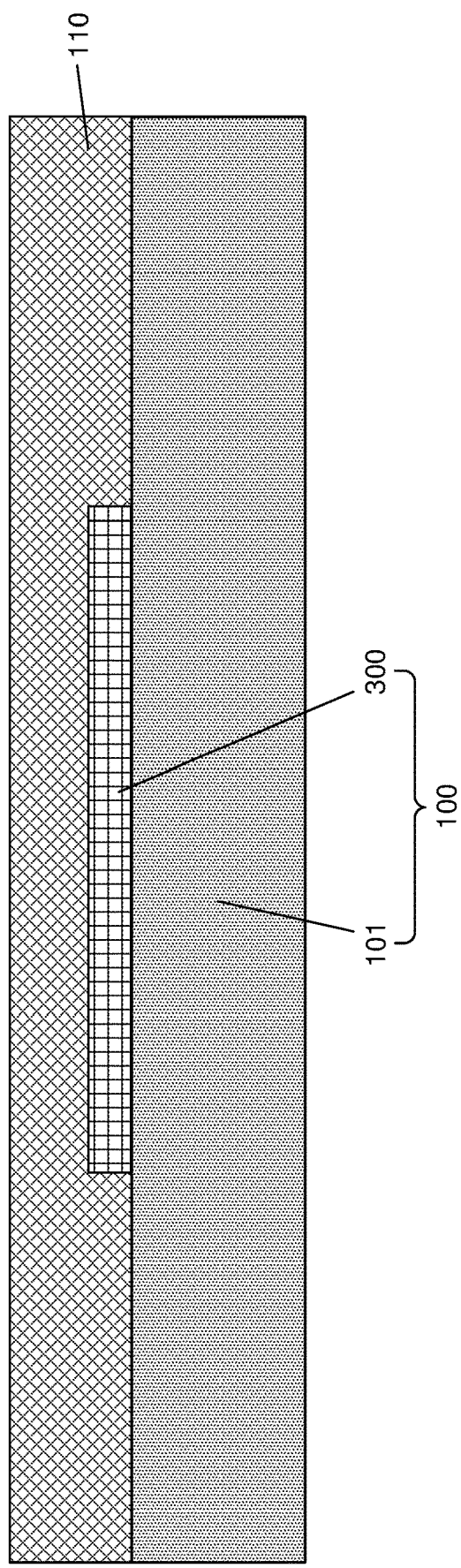

As illustrated in FIG. 2C, in step S2, the top surface of first dielectric layer 110 is planarized by, for example, a chemical mechanical polishing (CMP) process. As a result, the top surface of first dielectric layer 110 is parallel to the top surface of first substrate 101.

Figure 2D:
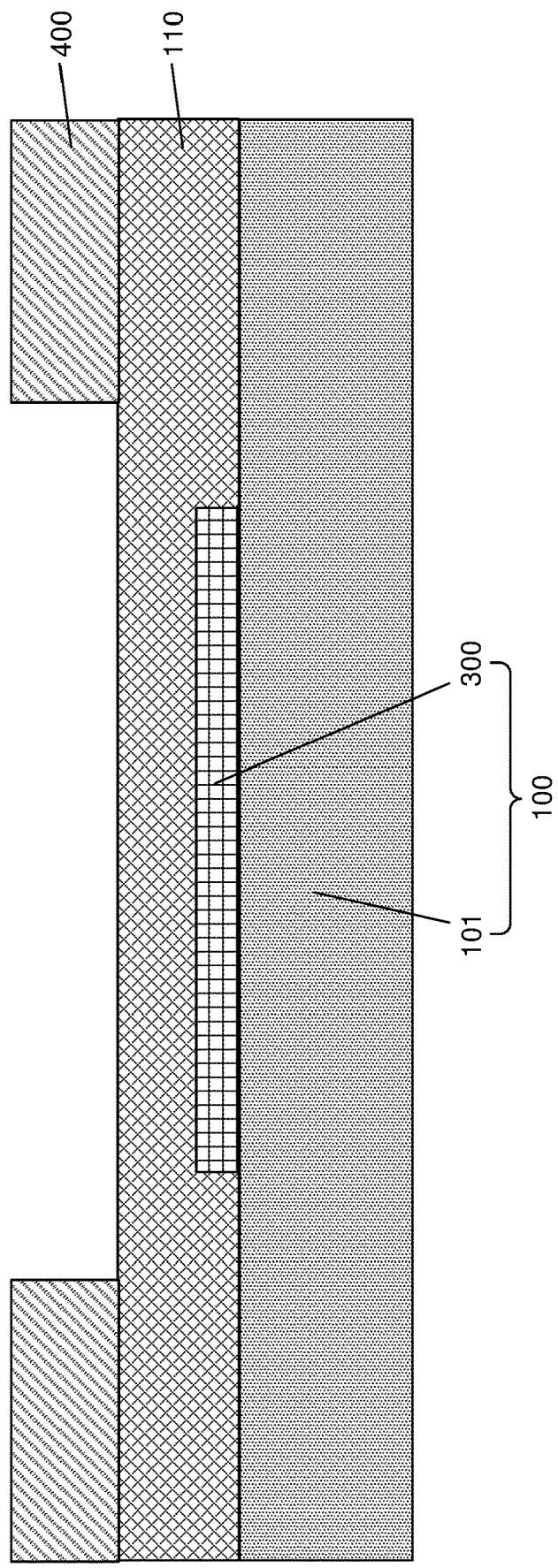

As illustrated in FIG. 2D, in step S3, a photolithography process is performed. Specifically, first, a photoresist layer 400 is coated on the structure of FIG. 2C. Photoresist layer 400 is exposed to a light with a mask (not shown) having a certain pattern, and the exposed photoresist layer is developed by a solvent, thereby transferring the pattern of the mask onto photoresist layer 400. Photoresist layer 400 exposes a part of first dielectric layer 110 that needs to be removed.

Figure 2E:
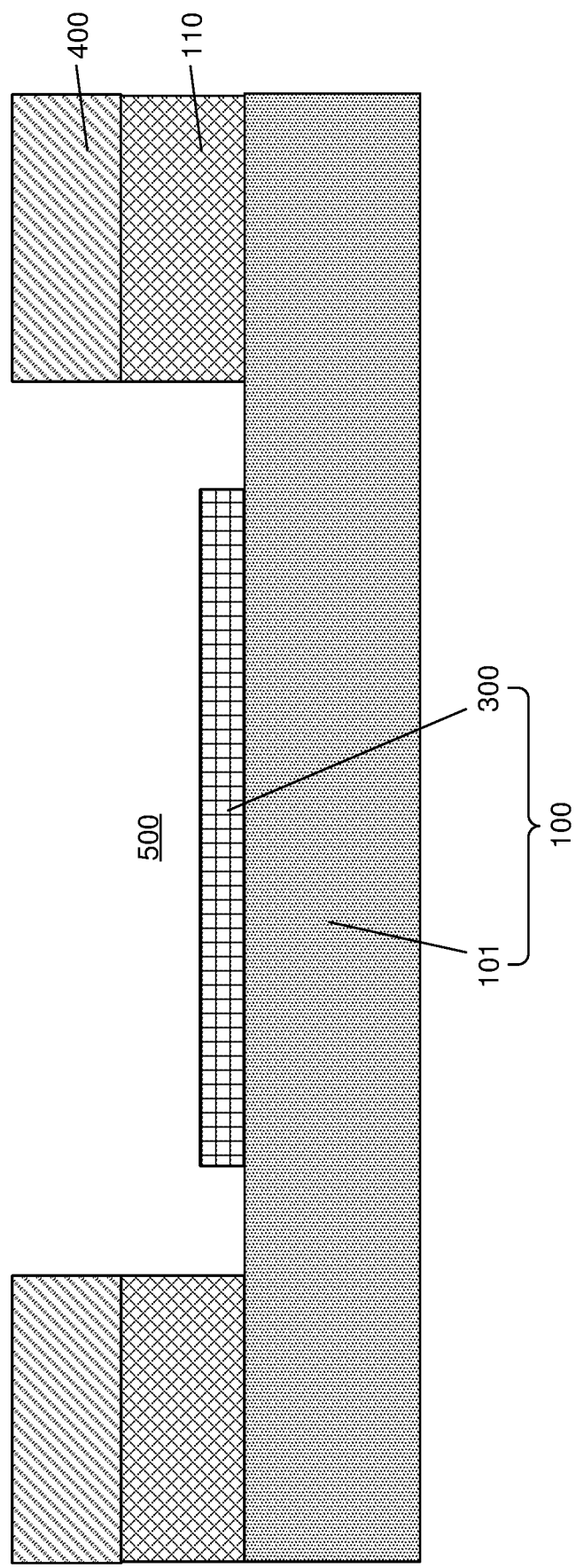

As illustrated in FIG. 2E, in step S4, first dielectric layer 110 is etched by using photoresist layer 400 as an etching mask, to expose at least a part of device structure 300 and a part of first substrate 101, thereby forming a space for forming cavity 500 (herein after referred to as "cavity space 500").

Figure 2F:
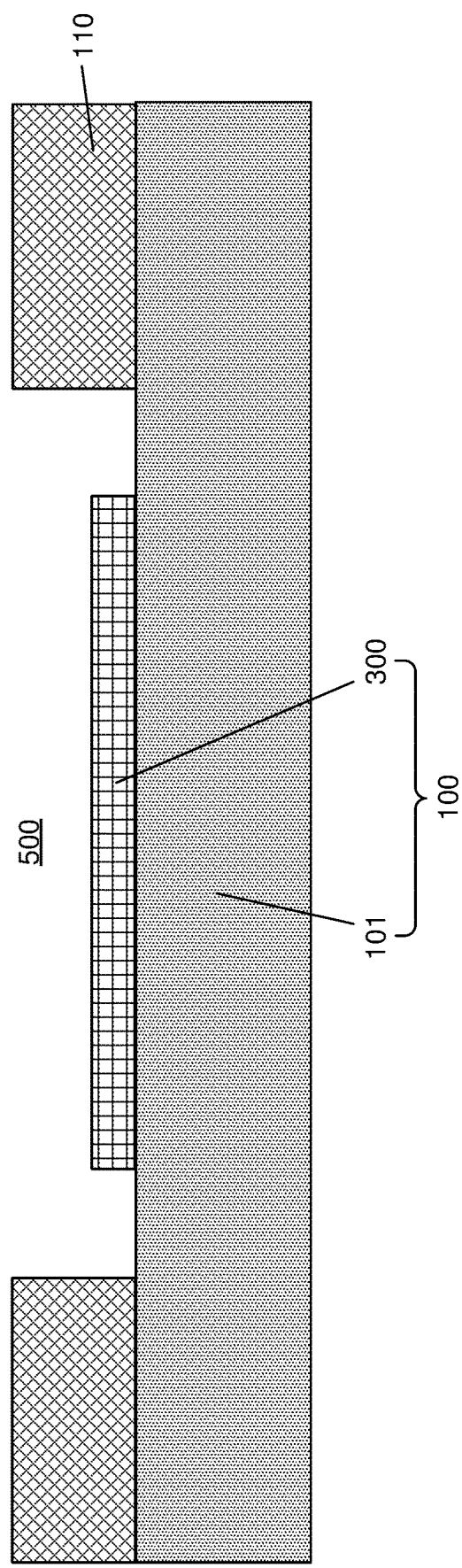
Figure 2G:
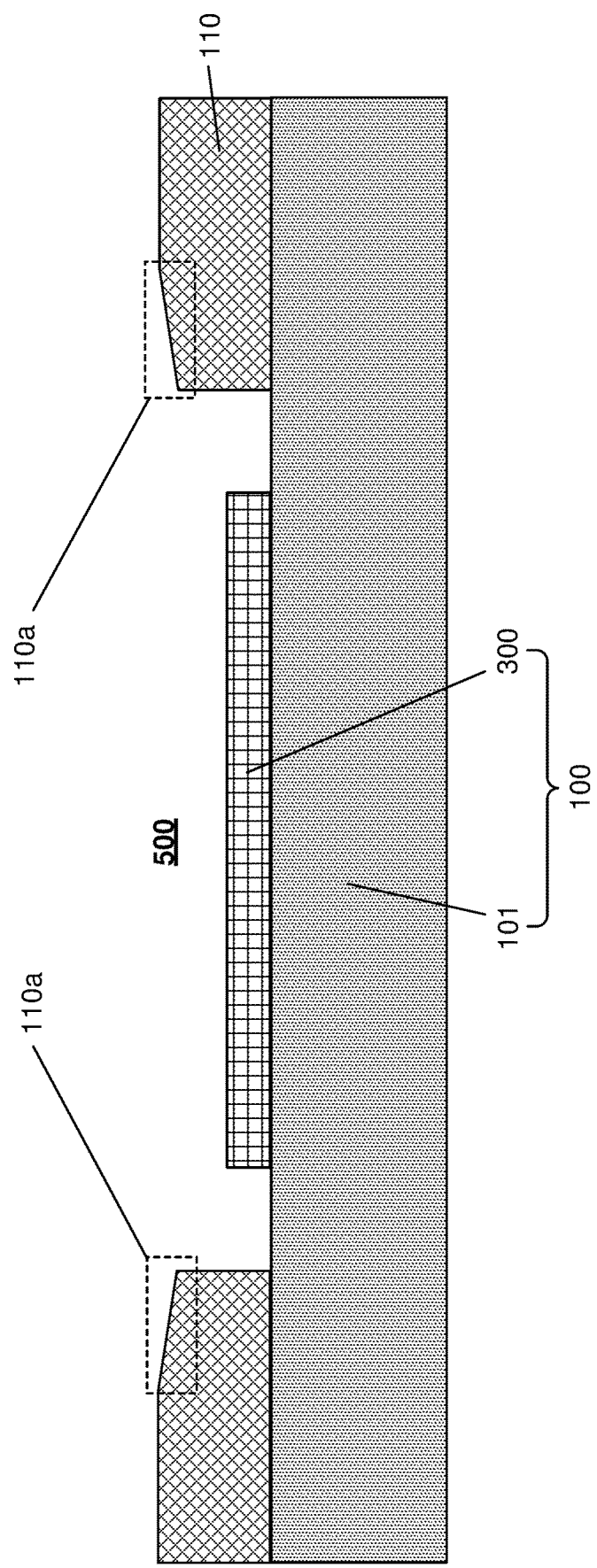

As illustrated in FIG. 2F, in step S5, photoresist layer 400 is removed, and the remaining structure is cleaned. At this time, the surface of first dielectric layer 110 has undergone a series of processes such as photolithography, etching, and cleaning, and thus the surface property of first dielectric layer 110 changes. For example, the surface of first dielectric layer 110 no longer has abundant unsaturated bonds, or the surface of first dielectric layer 110 is "contaminated" by the organic molecules in the series of processes. As a result, the surface of first dielectric layer 110 no longer has the same bonding activeness as when CMP is just completed. If first dielectric layer 110 having such a surface is directly bonded to second substrate 200, first dielectric layer 110 may not be effectively bonded to second substrate 200, or at least the bonding strength may be weak.

In order to solve the problem described above, as illustrated in FIG. 2G, in step S6, a slight CMP treatment is performed on the surface of first dielectric layer 110 to remove the part of the surface layer of first dielectric layer 110 that is not suitable for bonding, thereby restoring the bonding activeness of the surface of first dielectric layer 110. At this time, due to the existence of cavity space 500, the CMP process might cause a portion of the surface of first dielectric layer 110 close to cavity 500 to be inclined to form an inclined surface 110a.

As illustrated in FIGS. 2H and 2I, in step S7, second substrate 200 is bonded to device wafer 100 via first dielectric layer 110. At this time, inclined surface 110a might not be bonded with second substrate 200, thereby reducing the effective bonding area, weakening the bonding strength, and causing device reliability problems.

Figure 3:
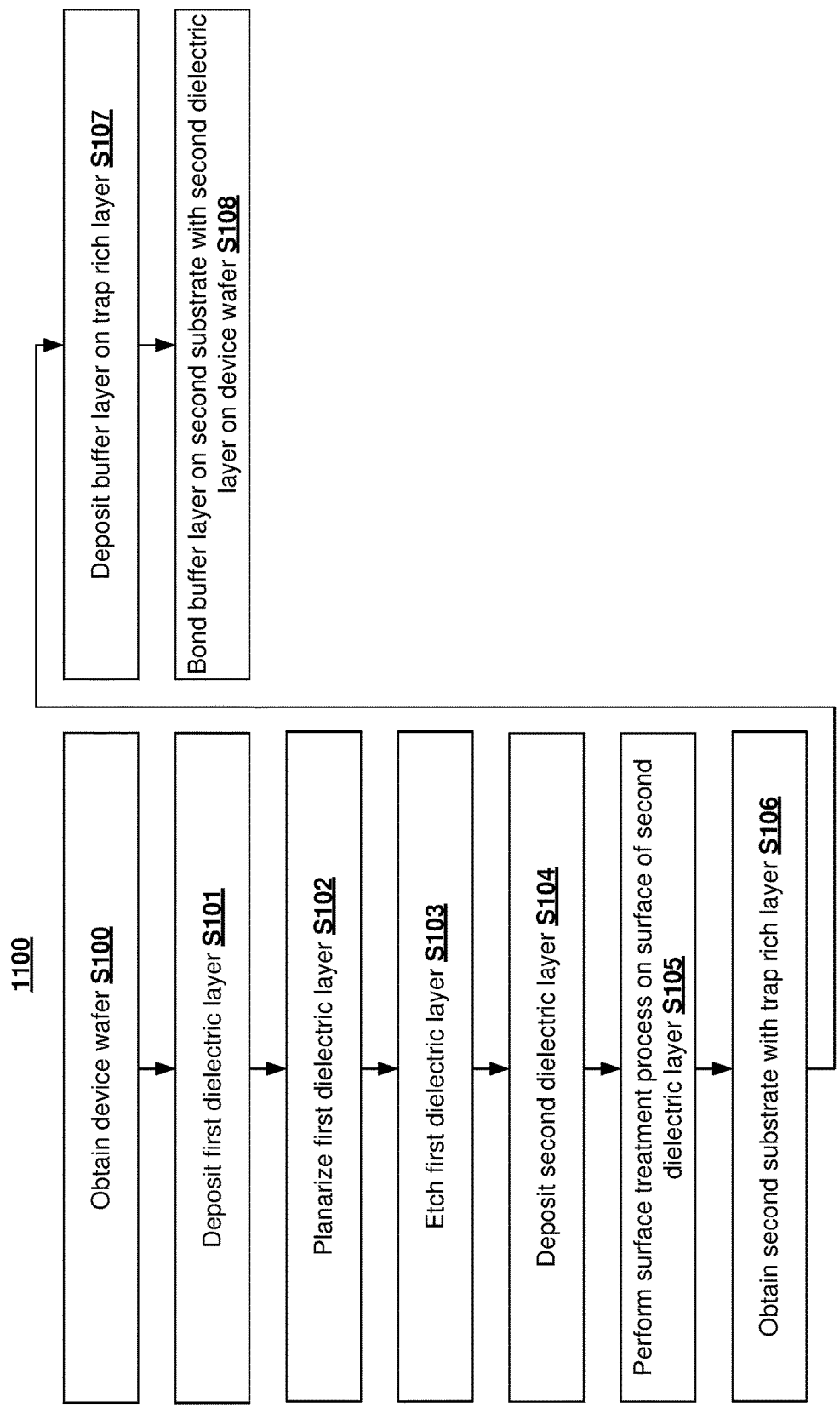
FIG. 3 is a flow chart of a process of fabricating the device of FIG. 1, according to an embodiment of the present disclosure.

FIG. 3 is a flow chart of a process 1100 of fabricating device 1000 of FIG. 1, according to an embodiment of the present disclosure. FIGS. 4A-4J are cross-sectional views of structures formed in process 1100, according to an embodiment of the present disclosure.

Figure 4A:
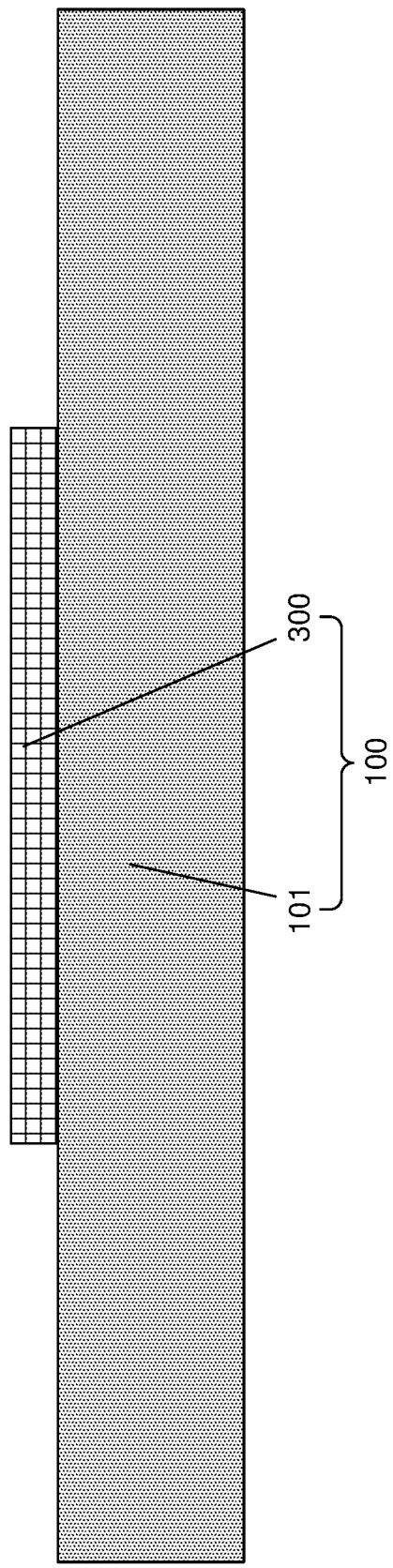

As illustrated in FIG. 4A, in step S100, device wafer 100 is obtained. Device wafer 100 includes first substrate 101 and device structure 300 formed on first substrate 101. Device structure 300 may include at least a portion of the device having the cavity to be fabricated. For example, the device may be a semiconductor device or a microelectromechanical system (MEMS) device, which may include at least one of a film bulk acoustic resonator (FBAR) resonator or filter, a MEMS microphone, a pressure sensor, an acceleration sensor, or a piezoelectric micromachined ultrasonic transducer (PMUT), or another device having a cavity structure.

Figure 4B:
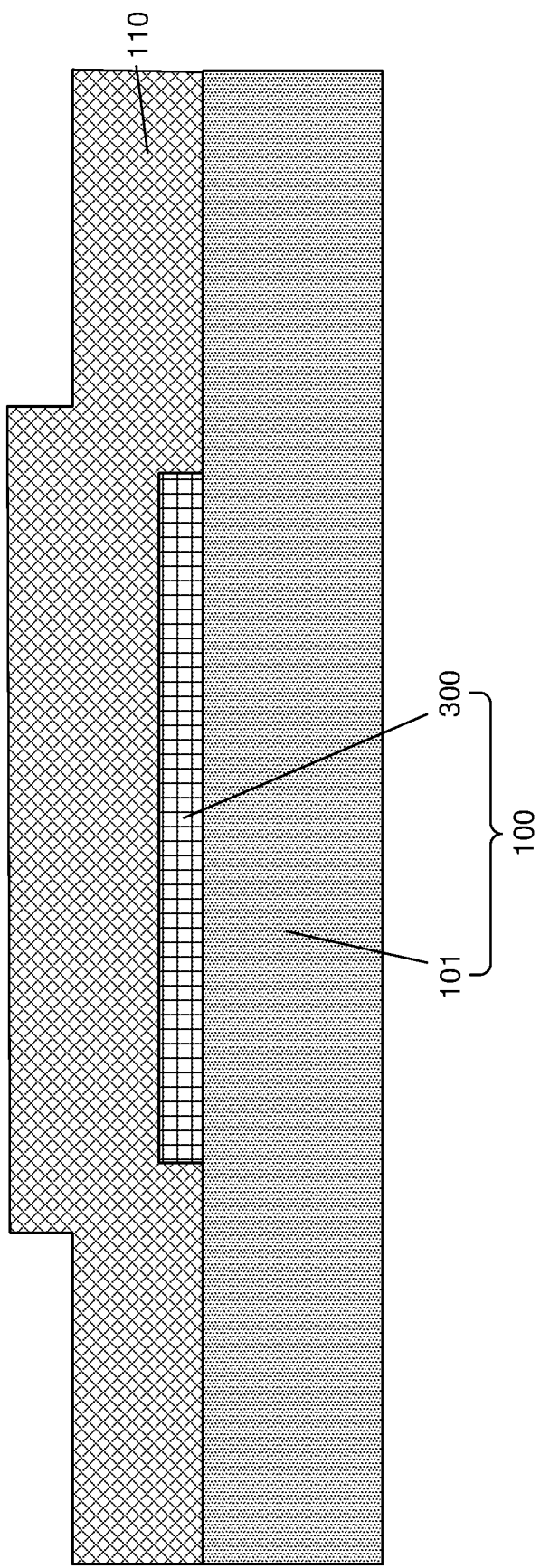

As illustrated in FIG. 4B, in step S101, first dielectric layer 110 is deposited on device wafer 100. First dielectric layer 110 may be formed of silicon, silicon oxide, silicon nitride, aluminum nitride, silicon oxynitride, or other materials, or a stacked combination of two or more of those materials.

Figure 4C:
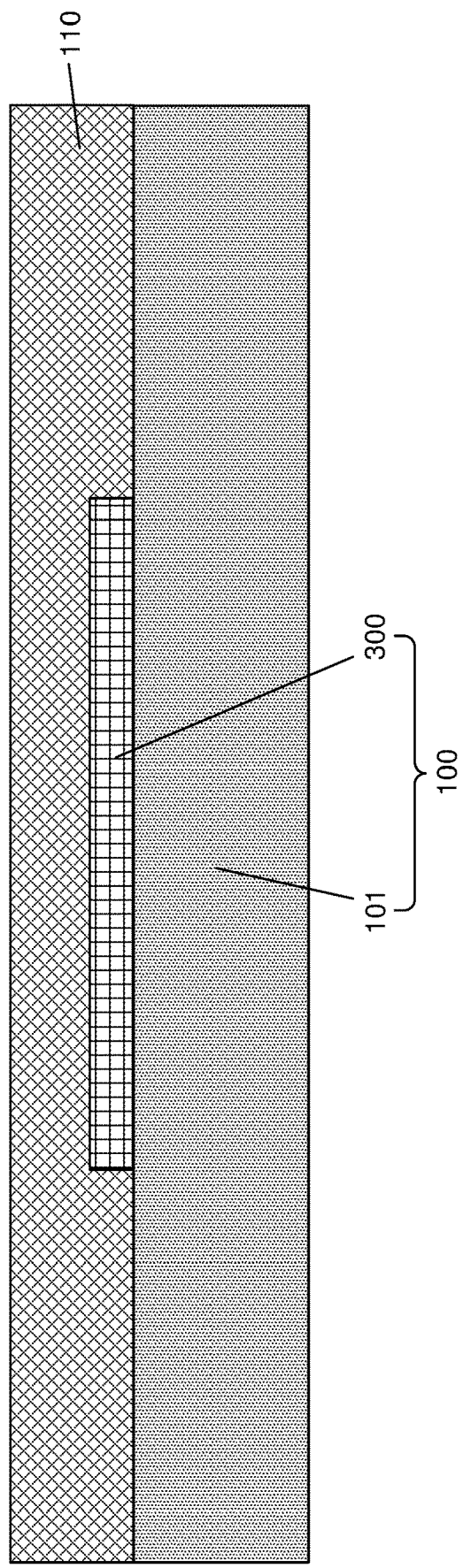

As illustrated in FIG. 4C, in step S102, the top surface of first dielectric layer 110 is planarized by, for example, a chemical mechanical polishing (CMP) process. As a result, the top surface of first dielectric layer 110 is parallel to the top surface of first substrate 101.

Figure 4D:
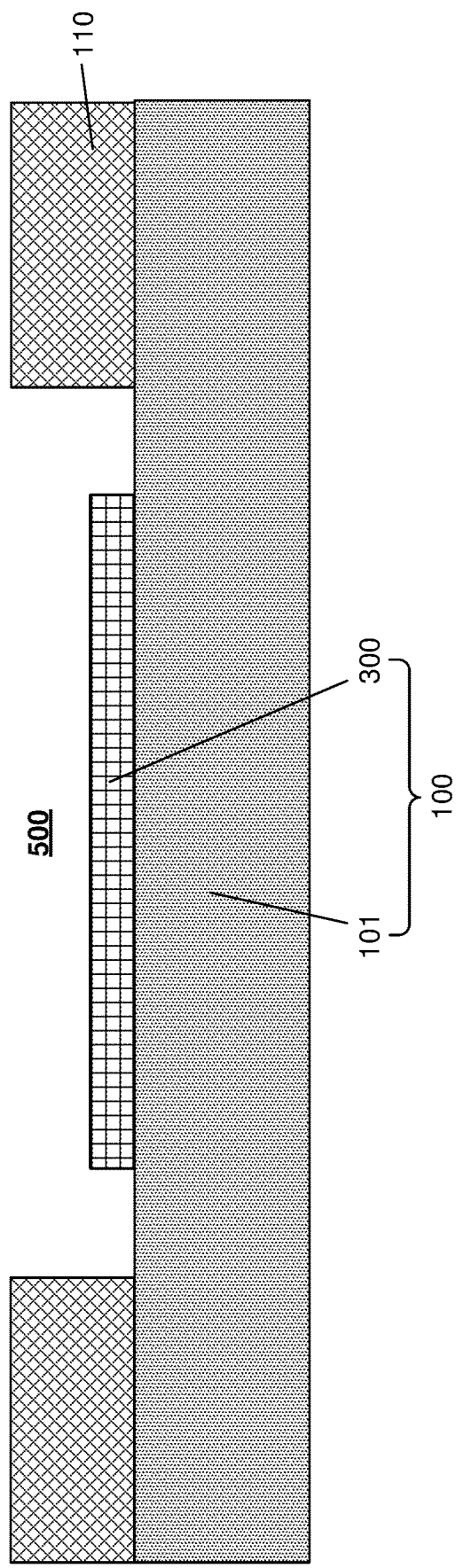

As illustrated in FIG. 4D, in step S103, a photolithography process is performed, and first dielectric layer 110 is etched to expose at least a part of device structure 300 and a part of first substrate 101, thereby forming a space for forming cavity 500 (herein after referred to as "cavity space 500"). Step S103 is similar to steps S3, S4, and S5 above, and therefore detailed description of step S103 is not repeated.

Figure 4E:
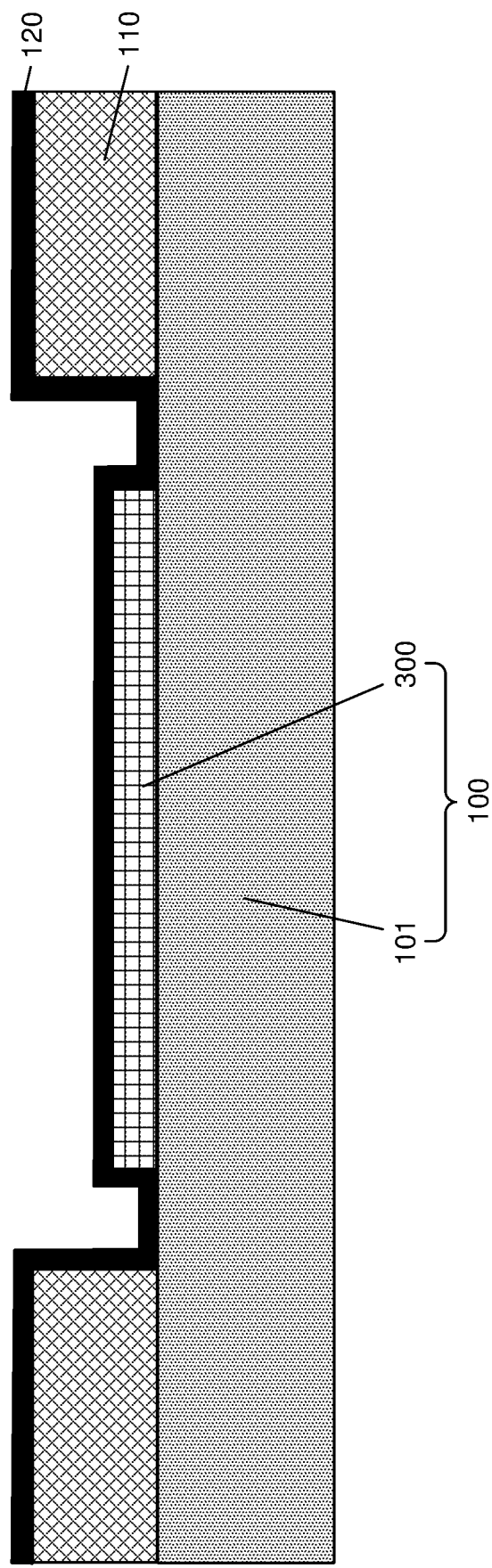

As illustrated in FIG. 4E, in step S104, second dielectric layer 120 is deposited on the structure of FIG. 4D. Second dielectric layer 120 covers the top surface and side surfaces of first dielectric layer 110, and the top surface and side surfaces of device structure 300. Second dielectric layer 120 is a thin layer having a thickness between approximately 10 nm to approximately 100 nm. Second dielectric layer 120 may be formed of silicon, silicon oxide, silicon nitride, aluminum nitride, silicon oxynitride, or other materials, or a stacked combination of two or more of those materials. Second dielectric layer 120 functions as a protective layer on the surface of device structure 300 to prevent the surface of device structure 300 from being damaged in subsequent processes. The material of second dielectric layer 120 may be the same as the material of the surface layer of first dielectric layer 110. In the embodiment of the present disclosure, the surface of first dielectric layer 110 is not treated by a CMP process. Therefore, the surface of first dielectric layer 110 will not be damaged by the CMP process to form an inclined surface, such as inclined surface 110a illustrated in FIG. 2G. Consequently, the entire top surface of first dielectric layer 110 is parallel to the surface of first substrate 101, and the entire surface of second dielectric layer 120 covering the surface of first dielectric layer 110 is also parallel to the surface of first substrate 101.

As illustrated in FIG. 4F, in step S105, a surface treatment process is performed on the surface of second dielectric layer 120 to activate the surface of second dielectric layer 120 for bonding. The surface treatment process may be a microphysical etching process which may include at least one of air plasma etching, ion beam etching (IBE), or fast atom beam (FAB) etching, or any other physical bombardment processes. The surface treatment process removes a surface part of second dielectric layer 120, so that at least a part of the molecular bonds of the material on the surface of second dielectric layer 120 are broken to facilitate the subsequent bonding process. At this time, the surface of second dielectric layer 120 is not treated by the CMP process, so the portion of the surface of second dielectric layer 120 close to the boundary of cavity space 500 will not be inclined. Consequently, the entire top surface of second dielectric layer 120 is parallel to the surface of first substrate 101. As a result, during a subsequent bonding process of bonding second substrate 200, the entire top surface of second dielectric layer 120 may be effectively bonded to second substrate 200, which increases the bonding surface area and bonding strength compared to the process described with respect to FIGS. 2A-2I.

Figure 4G:
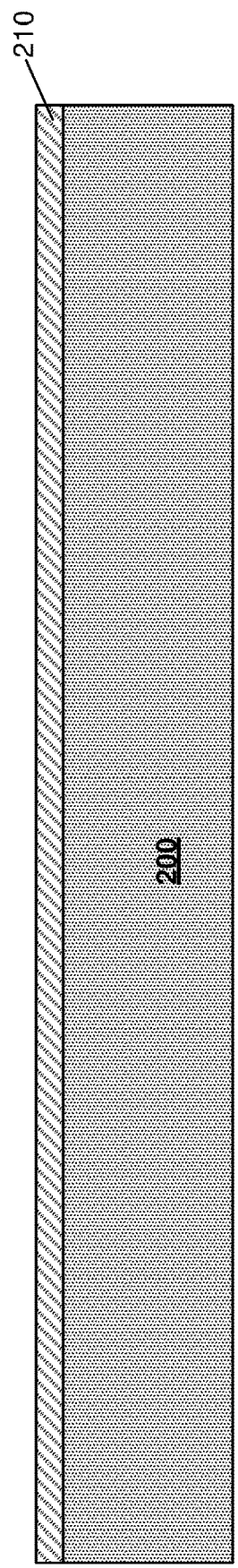

As illustrated in FIG. 4G, in step S106, second substrate (cap wafer) 200 is obtained, and trap rich layer 210 is formed on second substrate 200. Second substrate 200 may be formed of a single silicon material. Trap rich layer 210 may be formed of polysilicon, amorphous silicon, silicon nitride, aluminum nitride, gallium nitride, or a stacked combination of two or more of those materials.

As illustrated in FIG. 4H, in step S107, buffer layer 220 is formed on trap rich layer 210, and the surface of buffer layer 220 is polished by using, for example, a CMP surface polishing process, to form a material surface suitable for bonding. Buffer layer 220 may be formed of silicon oxide or silicon nitride.

As illustrated in FIGS. 4I and 4J, in step S108, buffer layer 220 on second substrate 200 and second dielectric layer 120 on device wafer 100 are attached and bonded to form cavity 500.

Figure 5:
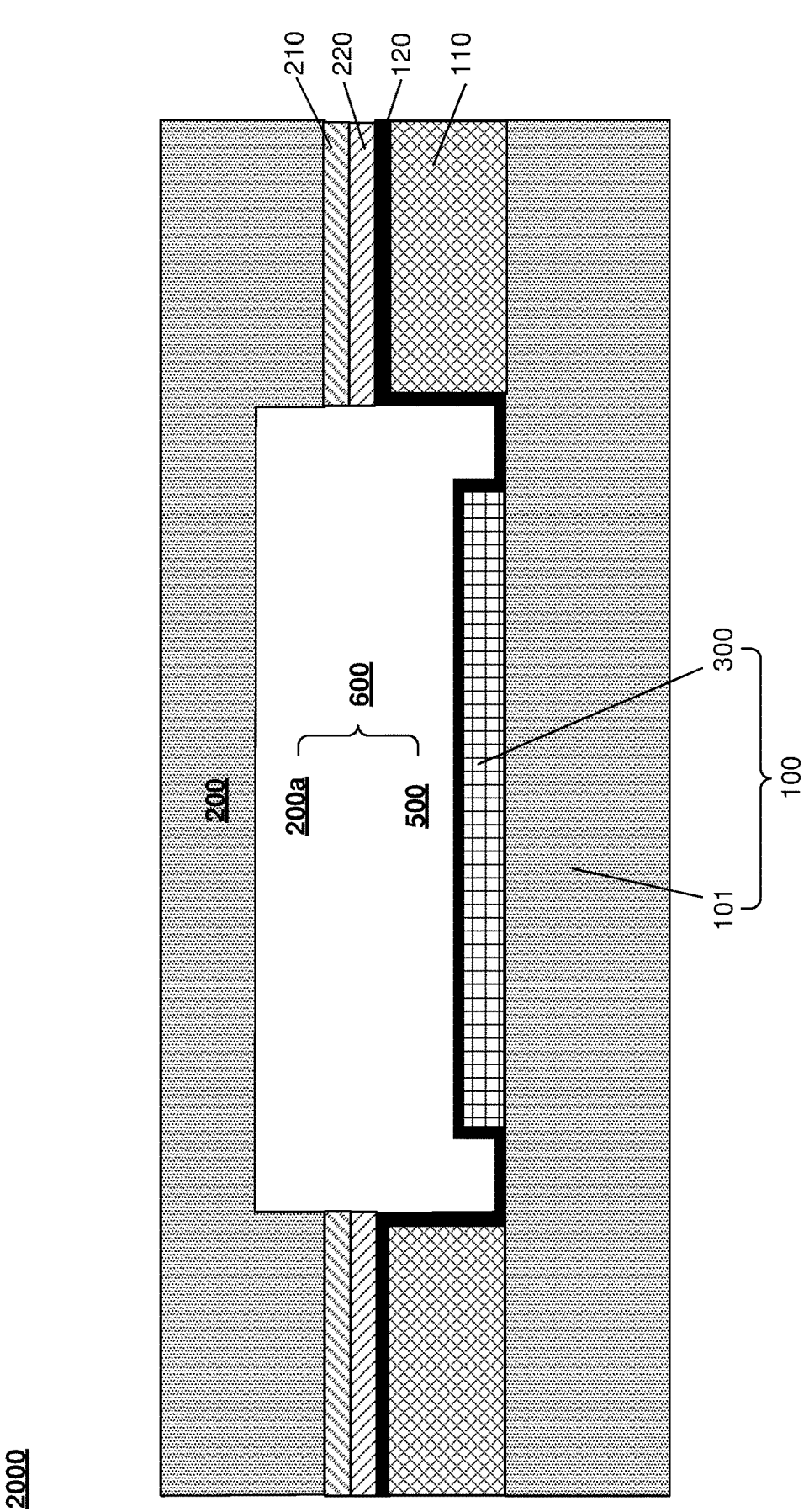
FIG. 5 is a cross-sectional view of a device having a cavity, according to another embodiment of the present disclosure.

FIG. 5 is a cross-sectional view of a device 2000 having a cavity 600, according to an embodiment of the present disclosure. Device 2000 of FIG. 5 is similar to device 1000 of FIG. 1, except that portions of second substrate 200, trap rich layer 210, and buffer layer 220 that are vertically aligned with cavity space 500 formed on device wafer 100, are removed, to form a recess 200a. Recess 200a and cavity space 500 together form cavity 600. Therefore, the volume of cavity 600 in device 2000 is greater than that of cavity 500 in device 1000. Except for cavity 600, the other components of device 2000 are the same as those of device 1000, and therefore detailed descriptions of those components are not repeated.

Figure 6:
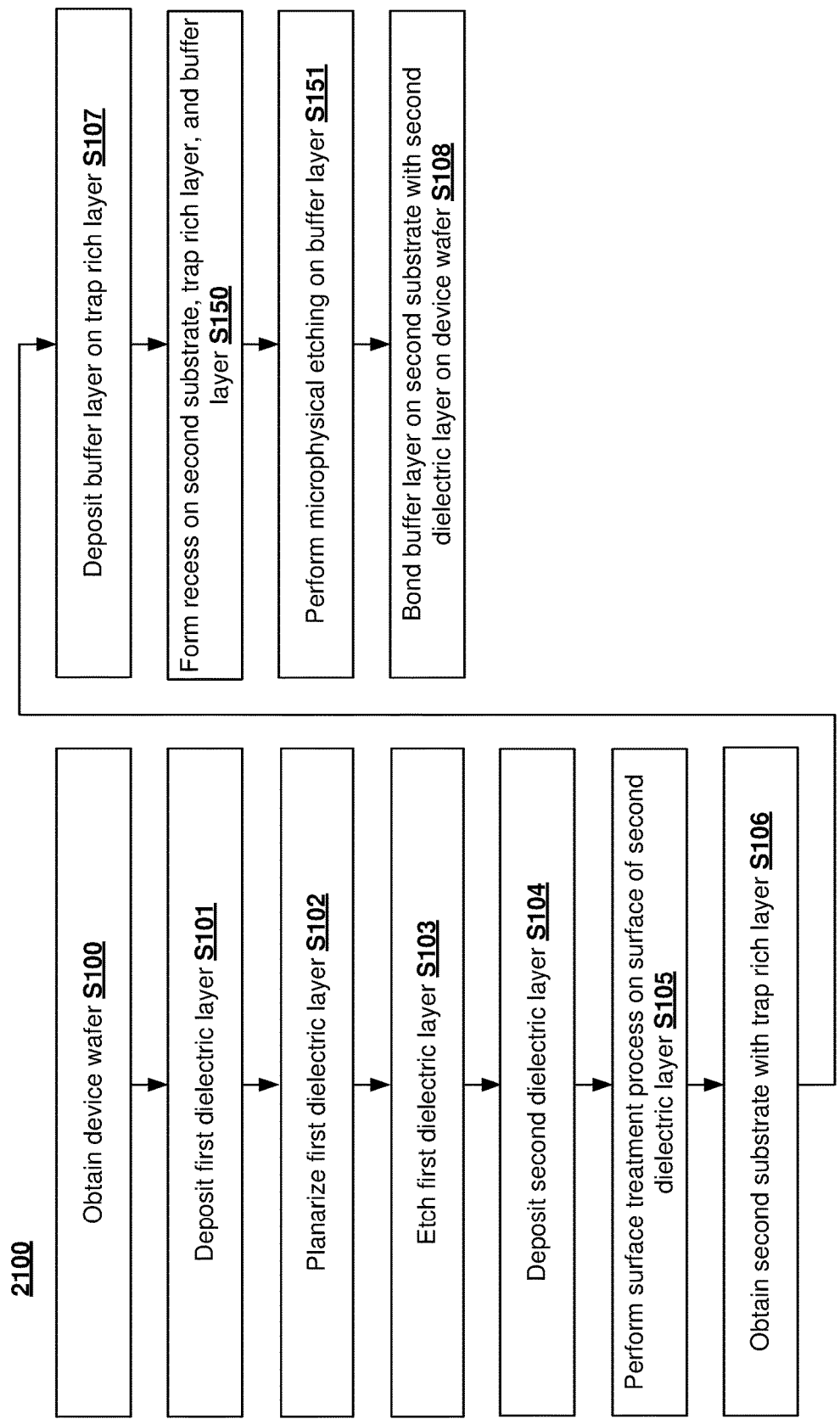
FIG. 6 is a flow chart of a process of fabricating the device of FIG. 5, according to an embodiment of the present disclosure.

FIG. 6 is a flow chart of a process 2100 of fabricating device 2000 of FIG. 5, according to an embodiment of the present disclosure. Process 2100 is similar to process 1100 of FIG. 3, except that additional steps S150 and S151 are performed after step S107 and before step S108. Therefore, detailed description of steps S150 and S151 is provided below, and detailed description of the other steps is not repeated.

FIGS. 7A-7D are cross-sectional views of structures formed in steps S150, S151, and S108 in process 2100, according to an embodiment of the present disclosure.

Figure 7A:
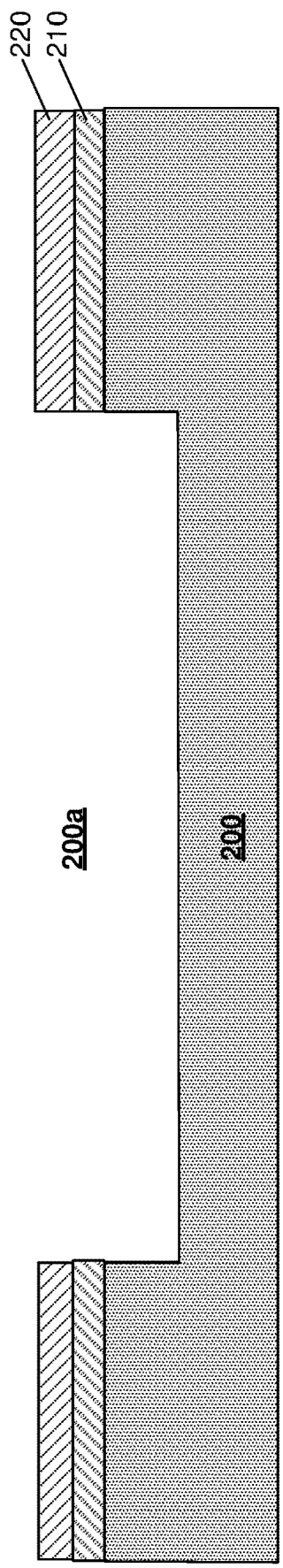

As illustrated in FIG. 7A, in step S150, after forming trap rich layer 210 and buffer layer 220 on second substrate 200, recess 200a is formed on second substrate 200 by etching buffer layer 220, trap rich layer 210, and second substrate 200. The location of recess 200a vertically corresponds to cavity space 500 formed on device wafer 100.

After etching and other processes, the surface of buffer layer 220 may not be suitable for bonding. Therefore, as illustrated in FIG. 7B, in step S151, a surface treatment process is performed on the surface of buffer layer 220 to remove a portion of buffer layer 220, so that at least a part of the molecular bonds of the material on the surface of buffer layer 220 are broken, so as to facilitate the subsequent bonding process. The surface treatment process may be a microphysical etching process which may include at least one of air plasma etching, ion beam etching (IBE), or fast atom beam (FAB) etching, or any other physical bombardment processes.

Figure 7C:
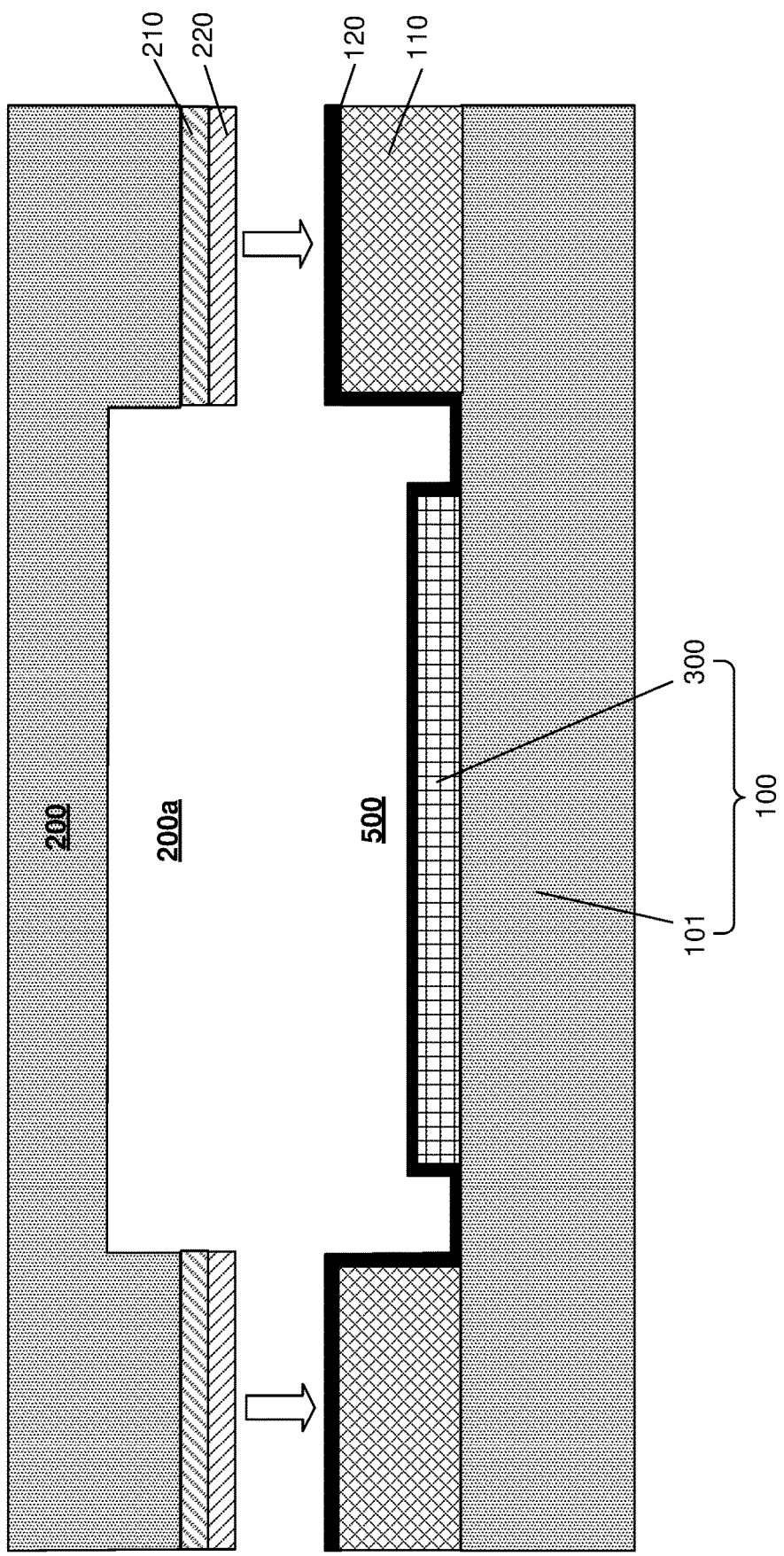
Figure 7D:
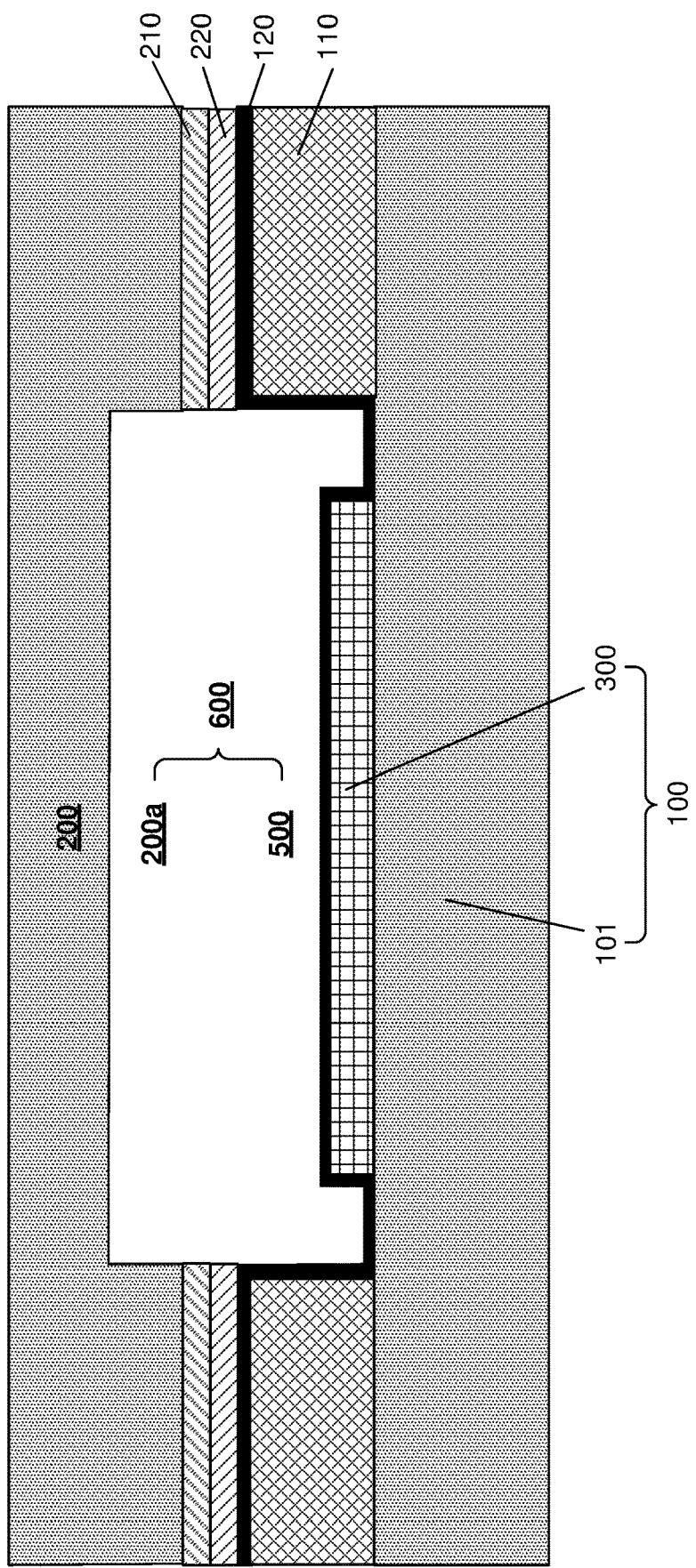

As illustrated in FIGS. 7C and 7D, in step S108, buffer layer 220 on second substrate 200 and second dielectric layer 120 on device wafer 100 are attached and bonded.

Thus, recess 200a formed on second substrate 200 and cavity space 500 formed on device wafer 100 together form cavity 600.

Other embodiments of the disclosure will be apparent to those skilled in the art from consideration of the specification and practice of the disclosure disclosed herein. It is intended that the specification and examples be considered as exemplary only, with a true scope and spirit of the invention being indicated by the following claims.

What is claimed is:

1. A method for fabricating a device having a cavity, comprising:
   obtaining a device wafer including a first substrate and a device structure formed on the first substrate;
   depositing a first dielectric layer on the device wafer;
   etching the first dielectric layer to expose the device structure and a portion of the first substrate;
   depositing, after the etching, a second dielectric layer on the device wafer and the first dielectric layer;
   performing a surface treatment on a surface of the second dielectric layer;
   obtaining a second substrate; and
   bonding the second substrate with the second dielectric layer on the device wafer, thereby forming the cavity between the second substrate and the device wafer.

2. The method of claim 1, wherein the device having the cavity includes a semiconductor device or a microelectromechanical system (MEMS) device, and the device structure formed on the first substrate includes at least a portion of the device having the cavity.

3. The method of claim 2, wherein the semiconductor device or the MEMS device includes at least one of a film bulk acoustic resonator (FBAR) resonator or filter, a MEMS microphone, a pressure sensor, an acceleration sensor, or a piezoelectric micromachined ultrasonic transducer (PMUT).

4. The method of claim 1, wherein the first dielectric layer is formed of silicon, silicon oxide, silicon nitride, aluminum nitride, silicon oxynitride, or a stacked combination of two or more of those materials.

5. The method of claim 1, further comprising:
   before etching the first dielectric layer, planarizing a top surface of the first dielectric layer by using chemical mechanical polishing (CMP).

6. The method of claim 1, wherein a thickness of the second dielectric layer is in a range from approximately 10 nm to approximately 100 nm.

7. The method of claim 1, wherein the second dielectric layer is formed of silicon, silicon oxide, silicon nitride, aluminum nitride, silicon oxynitride, or a stacked combination of two or more of those materials.

8. The method of claim 1, wherein the performing the surface treatment on the surface of the second dielectric layer comprises:
   performing a microphysical etching on the surface of the second dielectric layer to remove a surface layer of the second dielectric layer.

9. The method of claim 8, wherein the microphysical etching includes at least one of air plasma etching, ion beam etching (IBE), or fast atom beam (FAB) etching.

10. The method of claim 1, wherein the second substrate is formed of monocrystalline silicon.

11. The method of claim 1, further comprising, before bonding the second substrate with the second dielectric layer on the device wafer:
    forming a trap rich layer on the second substrate; and
    depositing a buffer layer on the trap rich layer.

12. The method of claim 11, wherein the trap rich layer is formed of polysilicon, amorphous silicon, silicon nitride, aluminum nitride, gallium nitride, or a stacked combination of two or more of those materials.

13. The method of claim 11, further comprising:
    after depositing the buffer layer and before bonding the second substrate with the second dielectric layer, performing a surface polishing treatment on the buffer layer by using chemical mechanical polishing (CMP).

14. The method of claim 11, wherein the buffer layer is formed of silicon oxide of silicon nitride.

15. The method of claim 11, after depositing the buffer layer and before bonding the second substrate with the second dielectric layer, further comprising:
    forming a recess on the second substrate by etching the buffer layer, the trap rich layer, and the second substrate;
    performing a surface treatment on a surface of the buffer layer,
    wherein the recess is a part of the cavity after bonding the second substrate to the second dielectric layer.

16. The method of claim 15, wherein the performing the surface treatment on the buffer layer comprises:
    performing a microphysical etching on the surface of the buffer layer to remove a surface layer of the buffer layer.

17. The method of claim 16, wherein the microphysical etching includes at least one of air plasma etching, ion beam etching (IBE), or fast atom beam (FAB) etching.

* * * * *

UNITED STATES PATENT AND TRADEMARK OFFICE
CERTIFICATE OF CORRECTION

PATENT NO. : 11,901,193 B2
APPLICATION NO. : 18/315091
DATED : February 13, 2024
INVENTOR(S) : Guojun Weng It is certified that error appears in the above-identified patent and that said Letters Patent is hereby corrected as shown below:

In the Claims

In Claim 14, Column 8, Line 29, "silicon oxide of silicon nitride." should read --silicon oxide or silicon nitride.--.

Signed and Sealed this
Third Day of September, 2024

Katherine Kelly Vidal
*Director of the United States Patent and Trademark Office*